United States Patent
Liu et al.

(10) Patent No.: US 10,734,830 B2
(45) Date of Patent: Aug. 4, 2020

(54) FAST CHANGING METHOD AND SYSTEM, TERMINAL, AND CHARGER

(71) Applicant: Huawei Technologies Co., Ltd., Shenzhen (CN)

(72) Inventors: Xujun Liu, Shenzhen (CN); Ce Liu, Shenzhen (CN); Yanding Liu, Shenzhen (CN); Jinbo Ma, Shenzhen (CN); Pinghua Wang, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 105 days.

(21) Appl. No.: 16/148,305

(22) Filed: Oct. 1, 2018

(65) Prior Publication Data
US 2019/0036354 A1 Jan. 31, 2019

Related U.S. Application Data

(63) Continuation of application No. PCT/CN2017/078098, filed on Mar. 24, 2017.

(30) Foreign Application Priority Data
Apr. 8, 2016 (CN) .......................... 2016 1 0218184

(51) Int. Cl.
*H02J 7/00* (2006.01)
*G01R 31/36* (2020.01)
*H01M 10/42* (2006.01)

(52) U.S. Cl.
CPC .......... *H02J 7/008* (2013.01); *G01R 31/3648* (2013.01); *H02J 7/00* (2013.01);
(Continued)

(58) Field of Classification Search
CPC ........ H02J 7/008; H02J 7/007184; H02J 7/00; H02J 7/0042; H02J 7/00034; H02J 7/045;
(Continued)

(56) References Cited

U.S. PATENT DOCUMENTS 6,172,481 B1 1/2001 Curtiss
7,937,058 B2* 5/2011 Rahman ............. H03H 11/1291
455/296
(Continued)

FOREIGN PATENT DOCUMENTS

CN 101874341 A 10/2010
CN 103078372 A 5/2013
(Continued)

OTHER PUBLICATIONS

Foreign Communication From a Counterpart Application, European Application No. 17778601.9, Extended European Search Report dated Dec. 3, 2018, 9 pages.
(Continued)

*Primary Examiner* — M Baye Diao
(74) *Attorney, Agent, or Firm* — Conley Rose, P.C.

(57) ABSTRACT

A terminal and a fast charging method to fast charge the terminal, where the method includes sending, by the terminal, instruction information to a charger connected to the terminal in order to instruct the charger to adjust an output voltage and an output current, converting, by the terminal, the output voltage of the charger into 1/K times the output voltage, and converting the output current of the charger into K times the output current such that a charging circuit between two sides of a battery charges the battery with the 1/K times the output voltage and the K times the output current, where K is a conversion coefficient of a conversion circuit with a fixed conversion ratio in the terminal and is a constant value, and K is any real number greater than one.

9 Claims, 8 Drawing Sheets

(52) U.S. Cl.
CPC ...... *H02J 7/0042* (2013.01); *H02J 7/007184* (2020.01); *H01M 10/4257* (2013.01); *H02J 7/00034* (2020.01)

(58) Field of Classification Search
CPC .. H02J 2207/20; H02J 7/00302; H02J 7/0077; H02J 7/0047; H02J 7/0031; G01R 31/3648; H01M 10/4257; H01M 10/44
USPC .......................................................... 320/111
See application file for complete search history.

(56) References Cited

U.S. PATENT DOCUMENTS

| | | | |
|---|---|---|---|
| 8,217,621 B2 * | 7/2012 | Tsai | H02J 7/025 320/108 |
| 8,405,361 B2 | 3/2013 | Richards et al. | |
| 8,509,290 B2 * | 8/2013 | Bellaouar | H03G 3/3047 330/10 |
| 9,187,000 B2 * | 11/2015 | Kuwano | B60L 58/13 |
| 10,601,251 B2 * | 3/2020 | Keith | H02J 7/0042 |
| 2005/0096518 A1 * | 5/2005 | Chang | A61B 5/0002 600/345 |
| 2009/0033289 A1 | 2/2009 | Xing et al. | |
| 2009/0174366 A1 | 7/2009 | Ahmad et al. | |
| 2014/0136863 A1 | 5/2014 | Fritchman et al. | |
| 2014/0300321 A1 | 10/2014 | Kim et al. | |
| 2014/0347003 A1 | 11/2014 | Sporck et al. | |
| 2015/0028680 A1 | 1/2015 | Zeuch et al. | |
| 2015/0035477 A1 | 2/2015 | Wong et al. | |
| 2015/0069958 A1 | 3/2015 | Yang et al. | |
| 2015/0194821 A1 | 7/2015 | Yoshimoto et al. | |
| 2015/0280486 A1 | 10/2015 | Hsu | |
| 2017/0237296 A1 * | 8/2017 | Keith | H02J 7/0042 307/104 |
| 2017/0358945 A1 | 12/2017 | Zhang et al. | |
| 2018/0241238 A1 | 8/2018 | Zhang et al. | |

FOREIGN PATENT DOCUMENTS

| | | |
|---|---|---|
| CN | 103236568 A | 8/2013 |
| CN | 103779907 A | 5/2014 |
| CN | 102769156 B | 4/2015 |
| CN | 104505888 A | 4/2015 |
| CN | 104810873 A | 7/2015 |
| CN | 204578156 U | 8/2015 |
| CN | 105264734 A | 1/2016 |
| EP | 2942853 A1 | 11/2015 |
| EP | 3101752 A1 | 12/2016 |
| EP | 3101758 A1 | 12/2016 |
| JP | H11103538 A | 4/1999 |
| WO | 2015113333 A1 | 8/2015 |
| WO | 2015113349 A1 | 8/2015 |

OTHER PUBLICATIONS

Machine Translation and Abstract of Chinese Publication No. CN102769156, Apr. 22, 2015, 7 pages.
Machine Translation and Abstract of Chinese Publication No. CN103078372, May 1, 2013, 9 pages.
Machine Translation and Abstract of Chinese Publication No. CN103236568, Aug. 7, 2013, 16 pages.
Machine Translation and Abstract of Chinese Publication No. CN104505888, Apr. 8, 2015, 13 pages.
Machine Translation and Abstract of Chinese Publication No. CN204578156, Aug. 19, 2015, 9 pages.
Machine Translation and Abstract of Chinese Publication No. JPH11103538, Apr. 13, 1999, 12 pages.
Yingjiu, "Enable rapid charging of mobile phone with Charger IC," Electronic Engineering and Product World, Jun. 2015, 5 pages.
English Translation of Yingjiu, "Enable rapid charging of mobile phone with Charger IC," Electronic Engineering and Product World, Jun. 2015, 1 page.
Foreign Communication From a Counterpart Application, Chinese Application No. 201610218184.8, Chinese Search Report dated Dec. 28, 2017, 11 pages.
Foreign Communication From a Counterpart Application, PCT Application No. PCT/CN2017/078098, English Translation of International Search Report dated Jun. 1, 2017, 2 pages.
Foreign Communication From a Counterpart Application, PCT Application No. PCT/CN2017/078098, English Translation of Written Opinion dated Jun. 1, 2017, 4 pages.

* cited by examiner

FAST CHANGING METHOD AND SYSTEM, TERMINAL, AND CHARGER

CROSS-REFERENCE TO RELATED APPLICATIONS

This application is a continuation of International Patent Application No. PCT/CN2017/078098 filed on Mar. 24, 2017, which claims priority to Chinese Patent Application No. 201610218184.8 filed on Apr. 8, 2016. The disclosures of the aforementioned applications are hereby incorporated by reference in their entireties.

TECHNICAL FIELD

The present application relates to a charging technology, and in particular, to a fast charging method and system, and an apparatus.

BACKGROUND

With development of technologies, terminals have increasingly powerful functions. Users may work and entertain themselves using the terminals, and a terminal has become indispensable in people's daily life. However, a battery life of a terminal is limited, and a user needs to charge the terminal constantly.

However, as a battery configured for the terminal has an increasingly large capacity and increasingly high density, it takes an increasingly long time to charge the terminal. Consequently, normal use of the user is greatly affected, and user experience is relatively poor.

SUMMARY

Embodiments of the present application provide a fast charging method and system, a terminal, and a charger, to fast charge the terminal, thereby improving user experience.

A first aspect of the present application discloses a terminal, and the terminal includes a detection circuit, a conversion circuit, a transmitter, a receiver, a central processing unit (CPU), a charging circuit, and a battery, where the detection circuit is configured to detect a value of a voltage between positive and negative electrodes of the battery, the CPU is configured to generate instruction information according to the value of the voltage between the positive and negative electrodes of the battery, the transmitter is configured to send the instruction information to a charger connected to the terminal in order to instruct the charger to adjust an output voltage and an output current, the receiver is configured to receive the output voltage and the output current transmitted from the charger, where the receiver is electrically connected to the charger, the conversion circuit is configured to convert the output voltage received by the receiver into 1/K times the output voltage, and convert the output current received by the receiver into K times the output current, where the conversion circuit is a conversion circuit with a fixed conversion ratio, the conversion coefficient K is a constant value, and K is any real number greater than 1, and the charging circuit is configured to charge the battery with the 1/K times the output voltage and the K times the output current.

It should be noted that the conversion circuit is a buck circuit or a switch-capacitor conversion circuit.

With reference to the content described in the first aspect, further, the CPU is configured to compare the value of the voltage between the positive and negative electrodes with a first preset threshold, to obtain a comparison result, and generate the instruction information according to the comparison result.

With reference to the content described above, it should be noted that the CPU is further configured to send a break connection notification to the receiver when detecting that the voltage between the positive and negative electrodes of the battery reaches a second preset threshold, and the receiver is configured to break an electrical connection to the charger according to the break connection notification, where the first preset threshold is less than or equal to the second preset threshold.

Further, it should be noted that the terminal further includes a memory and a bus system. The processor and the memory are connected using the bus system. The memory is configured to store an instruction. The processor is configured to execute the instruction stored in the memory such that the terminal is fast charged.

A second aspect of the present application discloses a charger, and the charger includes a receiver, a voltage adjustment circuit, and a current adjustment circuit, where the receiver is configured to receive instruction information sent by a terminal, where the instruction information includes a value of a voltage between positive and negative electrodes of a battery in the terminal and K times the value of the voltage between the positive and negative electrodes, and K is any real number greater than 1, the voltage adjustment circuit is configured to adjust a voltage value of an output voltage to K times the value of the voltage between the positive and negative electrodes of the battery, and the current adjustment circuit is configured to determine a charging mode according to the value of the voltage between the positive and negative electrodes of the battery, obtain a current value corresponding to the charging mode, and adjust an output current according to the corresponding current value, where the charging mode includes but is not limited to a pre-charging mode, a fast charging mode, and a float charging mode.

A third aspect of the present application discloses another charger, and the charger includes a receiver, a voltage adjustment circuit, and a current adjustment circuit, where the receiver is configured to receive instruction information sent by a terminal, where the instruction information includes a value of a voltage between positive and negative electrodes of a battery in the terminal, the voltage adjustment circuit is configured to adjust a voltage value of an output voltage to K times the value of the voltage between the positive and negative electrodes of the battery, where K is any real number greater than 1, and K is a voltage adjustment coefficient pre-stored in the charger, and the current adjustment circuit is configured to determine a charging mode according to the value of the voltage between the positive and negative electrodes of the battery, obtain a current value corresponding to the charging mode, and adjust an output current according to the corresponding current value, where the charging mode includes but is not limited to a pre-charging mode, a fast charging mode, and a float charging mode.

A fourth aspect of the present application discloses a fast charging system (FCS), the system includes a terminal, a charger, and a connection cable, and the terminal is connected to the charger using the connection cable, where the terminal is configured to obtain a value of a voltage between positive and negative electrodes of a battery in the terminal, the terminal is further configured to generate instruction information according to the value of the voltage between the positive and negative electrodes of the battery, and send the instruction information to the charger, the charger is configured to adjust a voltage value of an output voltage to K times the value of the voltage between the positive and negative electrodes of the battery according to the instruction information, where K is any real number greater than 1, the charger is further configured to determine a charging mode according to the instruction information, obtain a current value corresponding to the charging mode, and adjust an output current according to the corresponding current value, and the terminal is configured to convert the output voltage of the charger into 1/K times the output voltage, and convert the output current of the charger into K times the output current such that a charging circuit between the two ends of the battery charges the battery with the 1/K times the output voltage and the K times the output current, where K is a conversion coefficient of a conversion circuit with a fixed conversion ratio in the terminal and is a constant value.

With reference to the content described in the fourth aspect, that the terminal generates instruction information according to the value of the voltage between the positive and negative electrodes of the battery includes the terminal compares the value of the voltage between the positive and negative electrodes with a first preset threshold, to obtain a comparison result, and generates the instruction information according to the comparison result.

With reference to the content described in the fourth aspect, when the terminal in the system detects that the voltage between the positive and negative electrodes of the battery reaches a second preset threshold, the terminal can break an electrical connection between the terminal and the charger, or may instruct the charger to enter a sleep mode such that the charger stops supplying power to the terminal.

It should be noted that when a battery level reaches a third preset threshold, the terminal may further actively disconnect the electrical connection to the charger, or may instruct the charger to enter a sleep mode such that the charger stops supplying power to the terminal.

A fifth aspect of the present application discloses a fast charging method, and the method includes detecting a value of a voltage between positive and negative electrodes of a battery in a terminal, generating instruction information according to the value of the voltage between the positive and negative electrodes of the battery, sending the instruction information to a charger connected to the terminal in order to instruct the charger to adjust an output voltage and an output current according to the value of the voltage between the positive and negative electrodes of the battery, receiving, by the terminal, the output voltage and the output current transmitted from the charger, converting the output voltage of the charger into 1/K times the output voltage, and converting the output current of the charger into K times the output current, where K is a conversion coefficient of a conversion circuit with a fixed conversion ratio in the terminal, K is a constant value, and K is any real number greater than 1, and charging the battery with the 1/K times the output voltage and the K times the output current.

With reference to the content described in the fifth aspect, generating, by the terminal, instruction information according to the value of the voltage between the positive and negative electrodes of the battery includes comparing, by the terminal, the value of the voltage between the positive and negative electrodes with a first preset threshold to obtain a comparison result, and generating the instruction information according to the comparison result.

With reference to the content described in the fifth aspect, it should be noted that when the terminal is fully charged, or a battery level reaches a third preset threshold, or the voltage reaches a second preset threshold, the terminal breaks an electrical connection between the terminal and the charger or instructs the charger to stop charging.

A sixth aspect of the present application discloses another fast charging method, and the method includes receiving, by a charger, instruction information sent by a terminal, where the instruction information includes a value of a voltage between positive and negative electrodes of a battery in the terminal, adjusting, by the charger, a voltage value of an output voltage to K times the value of the voltage between the positive and negative electrodes of the battery, where K is any real number greater than 1, and K is a voltage adjustment coefficient pre-stored in the charger, and determining, by the charger, a charging mode according to the value of the voltage between the positive and negative electrodes of the battery, obtaining a current value corresponding to the charging mode, and adjusting an output current according to the corresponding current value.

It may be learned from the foregoing that the technical solutions of the present application provide a fast charging method and system, a terminal, and a charger. In the technical solutions provided in the present application, the instruction information is sent to the charger connected to the terminal in order to instruct the charger to adjust the output voltage and the output current. The terminal converts the output voltage of the charger into 1/K times the output voltage, and converts the output current of the charger into K times the output current. The conversion circuit is a conversion circuit with a fixed conversion ratio. The conversion coefficient K is a constant value, and K is any real number greater than 1. The charging circuit in the terminal charges the battery with the 1/K times the output voltage and the K times the output current. The terminal can be fast charged by implementing the technical solutions provided in the present application, thereby improving user experience.

BRIEF DESCRIPTION OF DRAWINGS

To describe the technical solutions in some of the embodiments of the present application more clearly, the following briefly describes the accompanying drawings describing some of the embodiments of the present application. The accompanying drawings in the following description show merely some embodiments of the present application, and a person of ordinary skill in the art may still derive other drawings from these accompanying drawings without creative efforts.

DESCRIPTION OF EMBODIMENTS

The following clearly describes the technical solutions in the embodiments of the present application with reference to the accompanying drawings in the embodiments of the present application. The described embodiments are a part rather than all of the embodiments of the present application. All other embodiments obtained by a person of ordinary skill in the art based on the embodiments of the present application without creative efforts shall fall within the protection scope of the present application.

As terminals become increasingly powerful, people become more dependent on the terminals, and even take the terminals at any time. People may communicate, work, entertain themselves, and do the like using the terminals, and a terminal plays an important role in daily life. An ensuing problem is that when a large quantity of applications simultaneously run for a long time, power of a terminal is consumed quickly. In addition, because a battery configured for the terminal has a large capacity and high density, a charging speed is relatively slow. Consequently, use of a user is greatly affected, and user experience is reduced.

The present application provides an FCS. The FCS can implement fast charging. For a detailed schematic diagram of the FCS, refer to FIG. 1. The system includes a terminal 10, a charger 20, and a connection cable 30. The terminal 10 is connected to the charger 20 using the connection cable 30.

Figure 1:
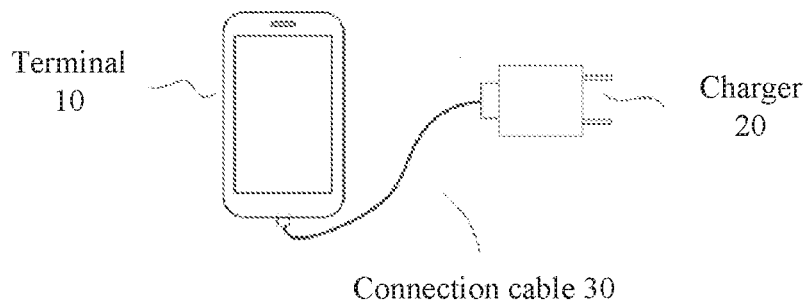
FIG. 1 is a schematic diagram of an FCS according to an embodiment of the present application.
Figure 2A:
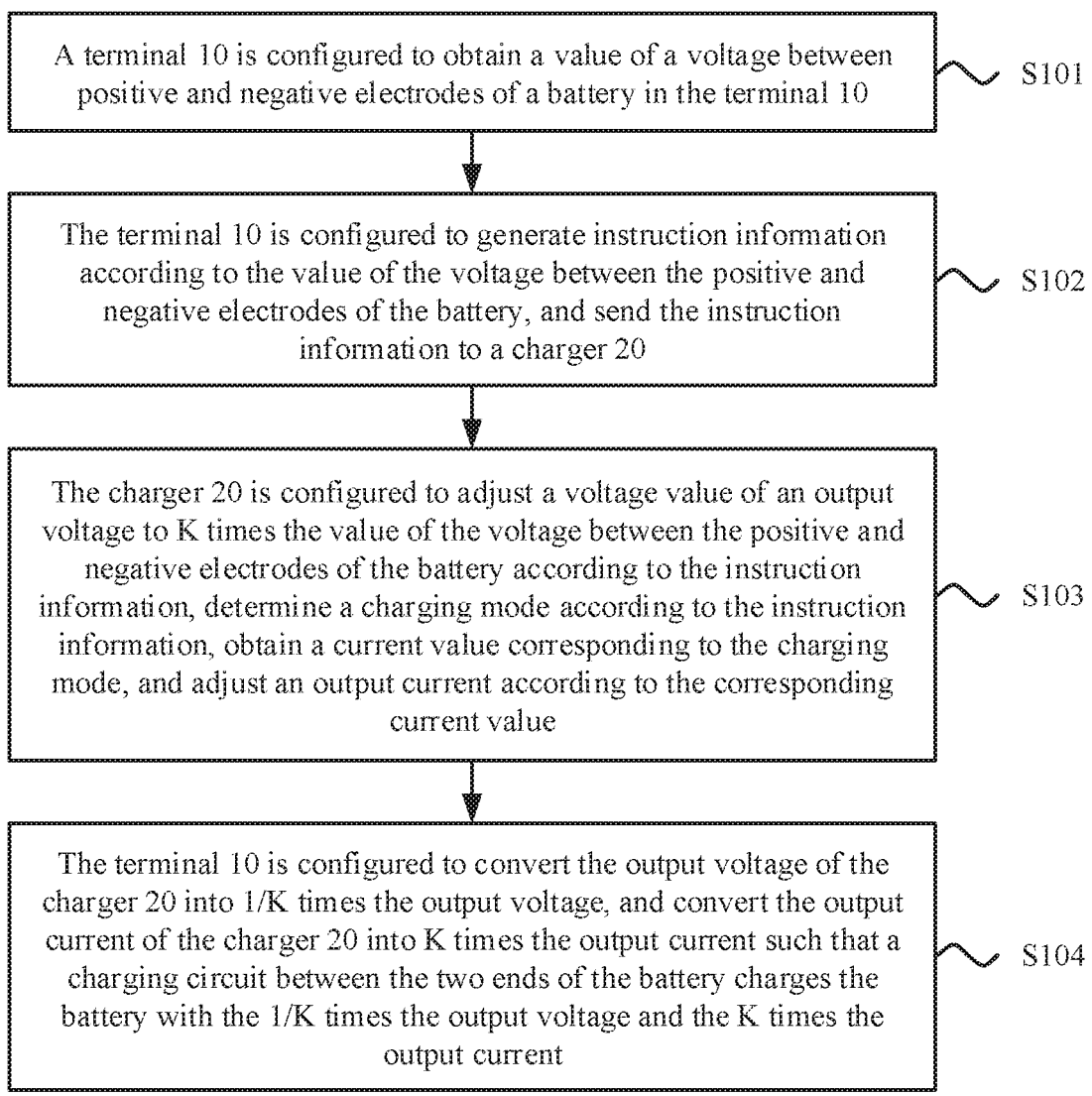
FIG. 2A is a flowchart of a fast charging method according to an embodiment of the present application.

It should be noted that as shown in FIG. 2A, the FCS implements fast charging using the following procedure with respect to FIG. 1.

Step S101. The terminal 10 is configured to obtain a value of a voltage between positive and negative electrodes of a battery in the terminal 10.

There are many manners of obtaining the voltage value of the battery. For example, a detection circuit may be formed by connecting the two ends of the battery such that the value of the voltage between the positive and negative electrodes of the battery can be obtained at any time.

The terminal 10 may be an electronic device such as a mobile phone, a tablet computer, an intelligent wearable device, or a computer.

The battery in the terminal 10 is usually a lithium-ion battery. A type of the battery is not limited herein.

Step S102. The terminal 10 is configured to generate instruction information according to the value of the voltage between the positive and negative electrodes of the battery, and send the instruction information to the charger 20.

It may be understood that the connection cable 30 between the terminal 10 and the charger 20 has a communication function, and may be used for transferring information between the terminal 10 and the charger 20.

It may be understood that in addition to the connection cable 30, there are communication lines (that is, a line D+ and a line D−) between the terminal 10 and the charger 20. Direct current voltages with various amplitudes are separately applied to the lines D+ and D−, and multiple status combinations are generated. Each state may represent one signal. For example, (0 volts (V), 0 V) represents that a charging current is 0 amperes (A). (0 V, 0.4 V) represents 0.5 A. (0.4 V, 0.4 V) represents 2 A. (2.8 V, 2.8 V) represents that charging stops. Optionally, pulse width modulation (PWM) voltages with a duty cycle are separately applied to the lines D+ and D−, and a pulse width is used to represent a signal.

It may be understood that, alternatively, communication may be performed between the terminal 10 and the charger 20 in a wireless manner.

Step S103. The charger 20 is configured to adjust a voltage value of an output voltage to K times the value of the voltage between the positive and negative electrodes of the battery according to the instruction information, determine a charging mode according to the instruction information, obtain a current value corresponding to the charging mode, and adjust an output current according to the corresponding current value, where K is any real number greater than 1.

It may be understood that the instruction information includes the value V1 of the voltage between the positive and negative electrodes of the battery and V2, that is, K times the value of the voltage between the positive and negative electrodes of the battery. Because K is greater than 1, V2 is greater than V1. The charger directly adjusts the output voltage to V2, that is, K times the value of the voltage between the positive and negative electrodes of the battery.

It may be understood that the instruction information includes the value V1 of the voltage between the positive and negative electrodes of the battery, and a voltage adjustment coefficient K is pre-stored in the charger. Therefore, the charger directly adjusts the output voltage to V2, that is, K times the value of the voltage between the positive and negative electrodes of the battery. The charger determines the charging mode according to the value V1 of the voltage between the positive and negative electrodes of the battery, then obtains the current value corresponding to the charging mode from a memory of the terminal, and adjusts the output current according to the corresponding current value.

Step S104. The terminal 10 is configured to convert the output voltage of the charger 20 into 1/K times the output voltage, and convert the output current of the charger 20 into K times the output current such that a charging circuit between the two ends of the battery charges the battery with the 1/K times the output voltage and the K times the output current, where K is a conversion coefficient of a conversion circuit with a fixed conversion ratio in the terminal and is a constant value.

It may be understood that, in a process of charging the terminal 10, the voltage between the positive and negative electrodes of the battery may be obtained at any time, and a charging current may be adjusted according to the value of the voltage. For example, the terminal 10 compares the obtained voltage value with a first preset threshold, obtains a comparison result, and generates the instruction information according to the comparison result to instruct the charger 20 to adjust the current. In addition, it should be noted that when the terminal 10 detects that the voltage between the positive and negative electrodes of the battery reaches a second preset threshold, the terminal 10 breaks an electrical connection between the terminal 10 and the charger 20. The first preset threshold is less than or equal to the second preset threshold.

It may be understood that, the terminal in the FCS provided in this embodiment of the present application uses a direct current (DC)/DC conversion manner with a fixed conversion ratio, works with a fixed maximum duty cycle, and continuously adjusts the output voltage and the output current of the charger based on a real-time voltage feedback of the battery, thereby effectively improving charging efficiency of the entire FCS and shortening a fast charging time.

Figure 2B:
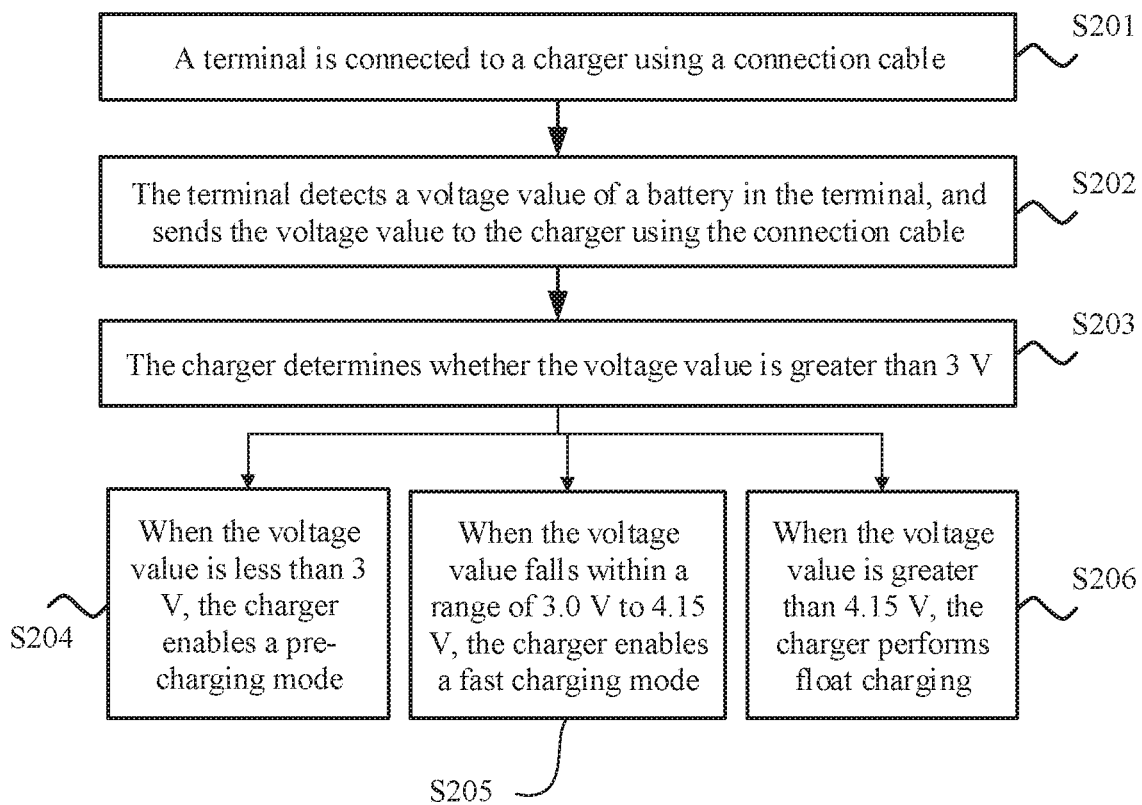
FIG. 2B is a flowchart of a fast charging method according to an embodiment of the present application.

As shown in FIG. 2B, in another embodiment of the present application, a specific fast charging method is provided. The method may be applied to the FCS described in FIG. 1. It is assumed that 3 V is a lower limit threshold of a fast charging voltage, 4.15 V is an upper limit threshold of the fast charging voltage, and a conversion coefficient K of a DC/DC conversion module with a fixed conversion ratio in a terminal is equal to 2, and the method includes the following steps.

Step S201. The terminal is connected to a charger using a connection cable.

Step S202. The terminal detects a value of a voltage between positive and negative electrodes of a battery in the terminal, and sends the voltage value to the charger using the connection cable.

Step S203. The charger determines whether the voltage value is greater than 3 V.

Step S204. When the voltage value is less than 3 V, the charger enables a pre-charging mode.

The pre-charging mode is as follows. When the voltage value is less than 3 V, the charger performs pre-charging with a small current, a selected pre-charging current is 0.2 C (a current range may be 0.05 C to 0.5 C). A current value of the pre-charging current may be preset at delivery, or may be manually set by a user within the current range. It should be noted that if a capacity of the battery is 3 ampere hours (Ah), 1 C represents 3 A.

Step S205. When the voltage value falls within a range of 3.0 V to 4.15 V, the charger enables a fast charging mode.

The fast charging mode is as follows. When the value of the voltage between the positive and negative electrodes of the battery falls within the range of 3.0 V to 4.15 V, the charger performs fast charging. The charger adjusts a specified charging current of 2.0 C (a current range may be 0.5 C to 10 C). A current value of the current may be preset at delivery, or may be manually set by a user within the current range. In this fast charging phase, an output voltage of the charger is V1, and V1 is determined according to a real-time feedback voltage $V_{battery}$ of the battery. Further, $V1=V_{battery} \times 2$. An output current of the charger is 2.0 C. A mobile phone side converts the output voltage V1 and the output current I1 of the charger using the DC/DC conversion module with a fixed conversion ratio. An output voltage V2 of the conversion circuit=$V1/2=V_{battery}$, and an output current 12=2.0 C×2=4.0 C.

Step S206. When the voltage value is greater than 4.15 V, the charger performs float charging.

The float charging may be understood as charging with a constant voltage or a small current.

When the feedback voltage of the battery exceeds 4.15 V, the charger adjusts the charging current. A charging current range is 0.01 C to 1.0 C. A current value of the current may be preset at delivery, or may be manually set by a user within the current range.

Figure 3A:
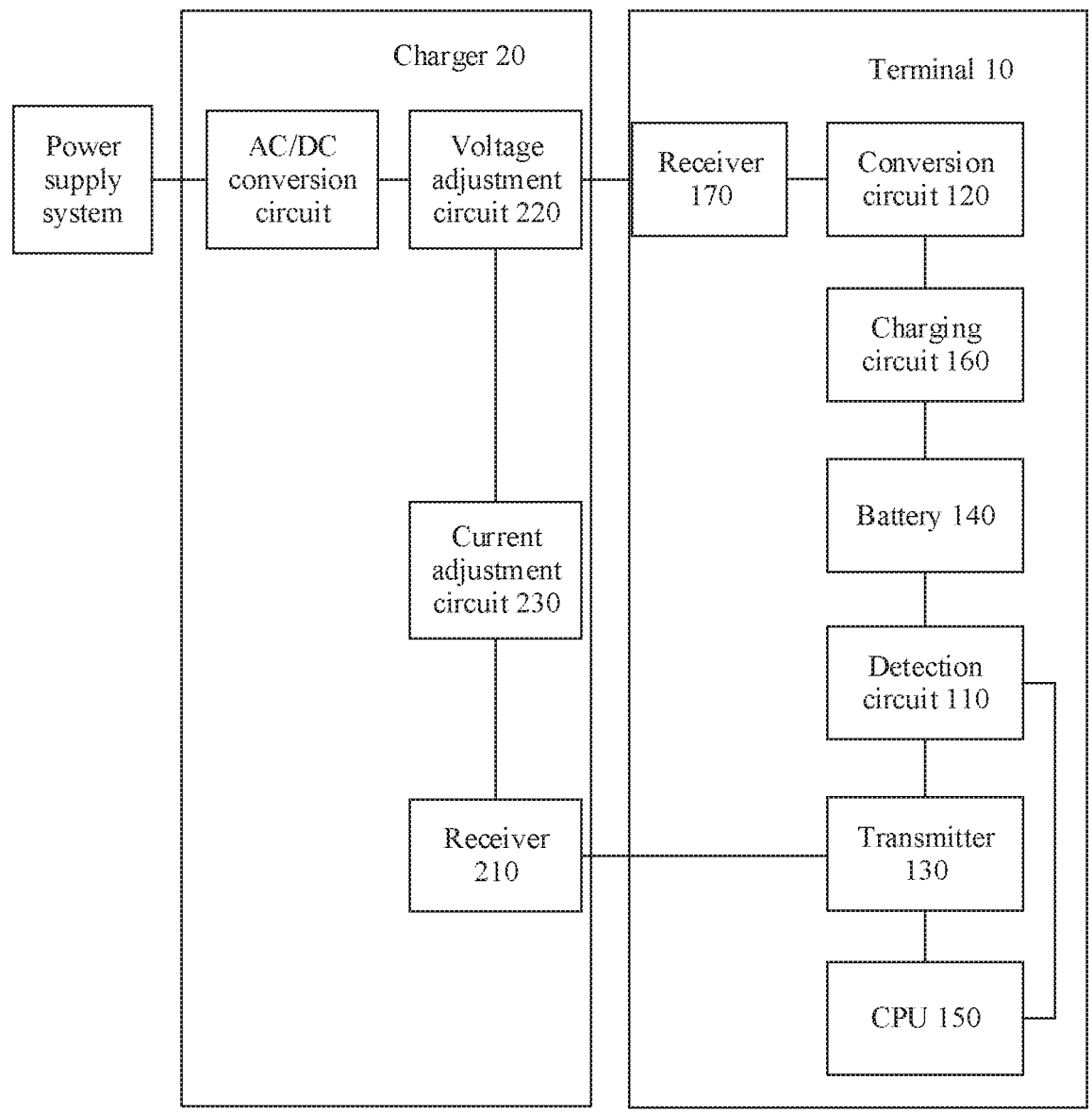
FIG. 3A is a structural diagram of an FCS according to another embodiment of the present application.

The following describes in detail structures of a terminal and a charger in an FCS according to an embodiment of the present application with reference to FIG. 3A. As shown in FIG. 3A, a terminal 10 in the FCS includes a detection circuit 110, a conversion circuit 120, a transmitter 130, a battery 140, a CPU 150, a charging circuit 160, and a receiver 170.

The detection circuit 110 is configured to detect a value of a voltage between positive and negative electrodes of the battery 140.

Figure 3B:
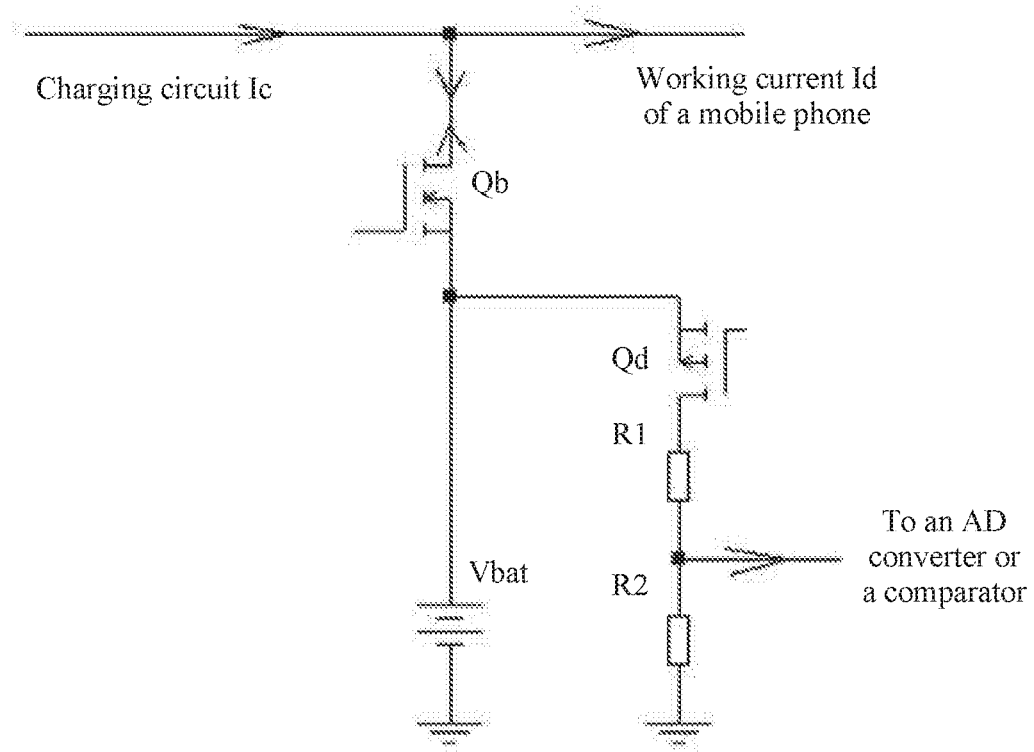
FIG. 3B is a diagram of a physical structure of a terminal according to another embodiment of the present application.

For example, as shown in FIG. 3B, in a specific detection circuit for detecting a voltage of a battery in a mobile phone, a switch Qb is serially connected to the battery. During charging, the switch Qb is turned on. When the voltage of the battery is being detected, the switch Qb is turned off.

Both a charging current and a discharging current are 0 such that voltage drops of the cable and internal resistance drop to the minimum. Qd is turned on at the same time. The voltage of the battery is divided by R1 and R2 resistors and sent to a back-end analog-to-digital (AD) converter or a comparator to obtain the voltage of the battery.

The CPU 150 is configured to generate instruction information according to the value of the voltage between the positive and negative electrodes of the battery 140.

The transmitter 130 is configured to send the instruction information to a charger 20 connected to the terminal 10 in order to instruct the charger 20 to adjust an output voltage and an output current.

The receiver 170 is configured to receive the output voltage and the output current transmitted from the charger 20, where the receiver 170 is electrically connected to the charger 20.

The conversion circuit 120 is configured to convert the output voltage received by the receiver 170 into 1/K times the output voltage, and convert the output current received by the receiver 170 into K times the output current, where the conversion circuit 120 is a conversion circuit with a fixed conversion ratio, the conversion coefficient K is a constant value, and K is any real number greater than 1.

The charging circuit 160 is configured to charge the battery 140 with the 1/K times the output voltage and the K times the output current.

Optionally, the conversion circuit 120 is a buck circuit or a switch-capacitor conversion circuit.

Figure 4:
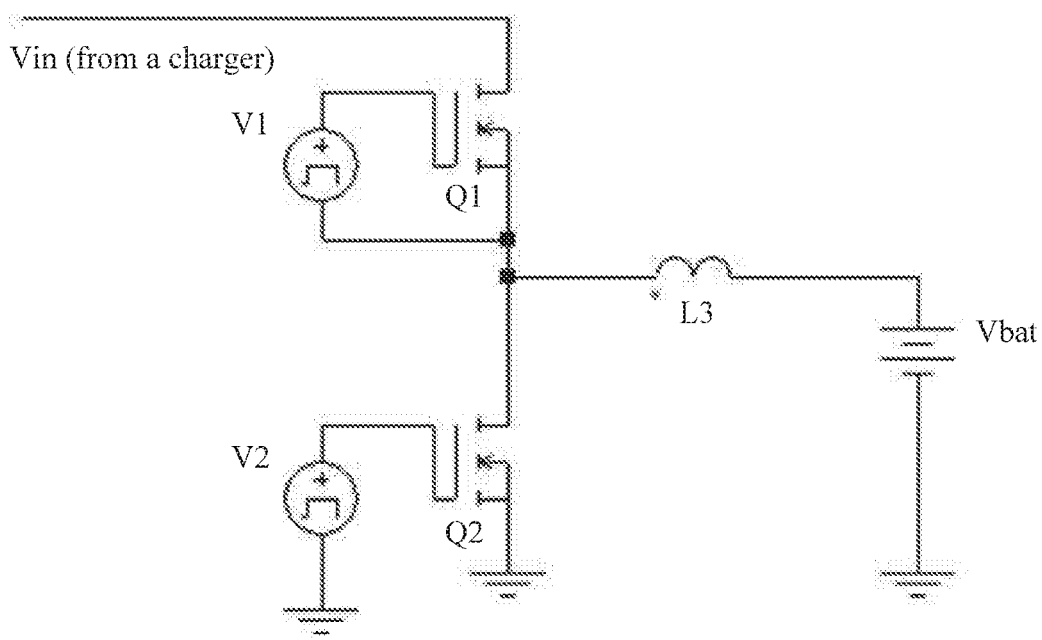
FIG. 4 is a diagram of a buck circuit according to an embodiment of the present application.

For example, as shown in FIG. 4, the conversion circuit 120 uses a buck manner with a fixed duty cycle. In a buck with a fixed duty cycle, switching transistors Q1 and Q2 form a bridge arm. Drive signals V1 and V2 drive Q1 and Q2 to be alternatively turned on to convert a direct current voltage Vin into a pulse voltage with a fixed duty cycle, and implement a voltage drop with a conversion coefficient of K. A direct current voltage Vout is output after filtering of an inductor L3, and Vout=Vin/K. The duty cycle is fixed at a maximum value to implement efficient charging. In addition, in the buck manner with a fixed duty cycle, multiple bucks may be connected in parallel according to a sequence of phases to form a multiphase buck.

Figure 5:
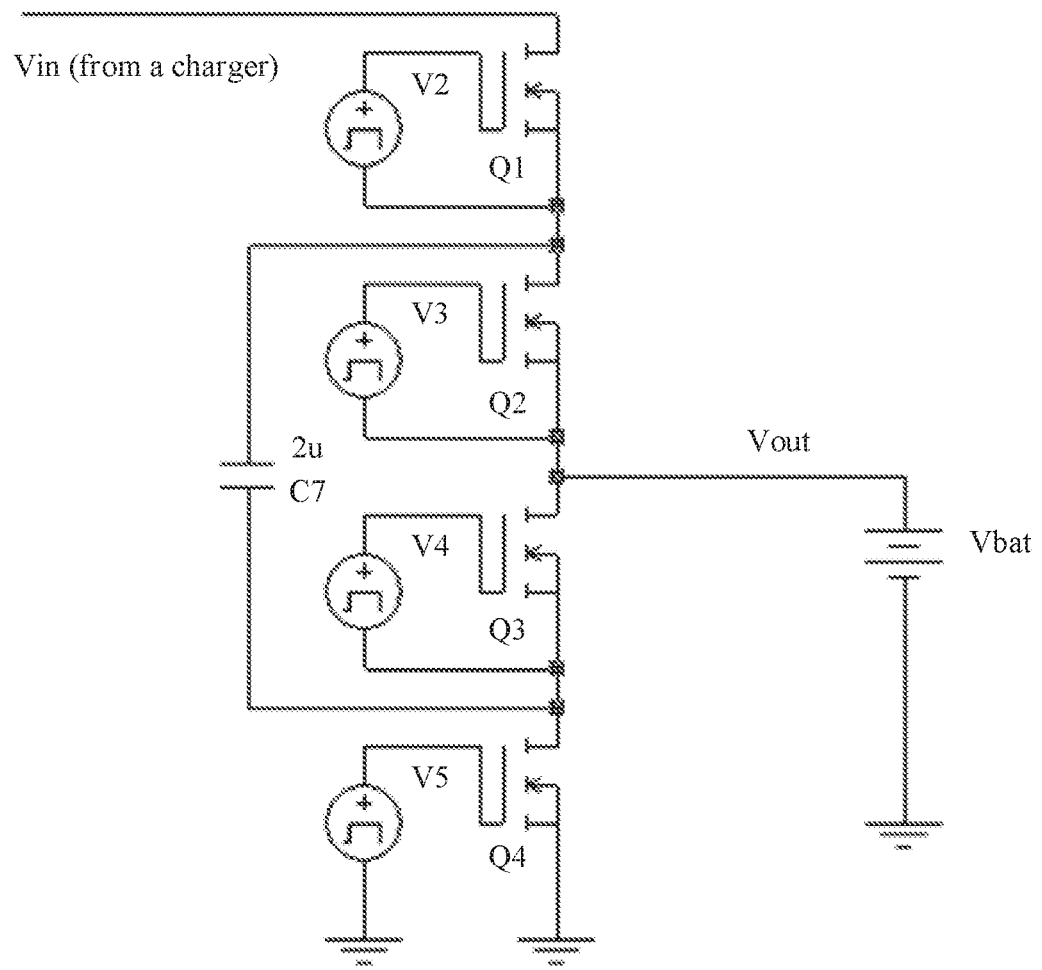
FIG. 5 is a circuit diagram of a switch-capacitor converter according to another embodiment of the present application.

For example, as shown in FIG. 5, the DC/DC conversion module may be further a switch-capacitor converter. Four switching transistors (designated as Q1, Q2, Q3, and Q4) in the switch-capacitor converter are connected in series. A capacitor C7 is connected between a midpoint of Q1 and Q2 and a midpoint of Q3 and Q4. V2, V3, V4 and V5 are drivers of the switching transistors. V2 and V5 are complementary. V3 and V4 are complementary. A 2:1 switch-capacitor converter may drop an input voltage to a half of the input voltage at a fixed ratio of 2:1. After conversion performed on Vin by the conversion circuit, an output voltage Vout=Vin/2. Switch-capacitor conversion does not need an inductor, and a loss can be significantly reduced. Therefore, conversion efficiency can be significantly improved, and a larger charging current can be implemented.

It may be understood that, in a process of charging the terminal 10, the voltage of the battery 140 is continuously increased, and therefore it is required to continuously instruct the charger 20 to adjust an output current. Therefore, the CPU 150 is further configured to compare the voltage value obtained by the detection circuit 110 with a first preset threshold to obtain a comparison result, and generate instruction information according to the comparison result. The transmitter 130 is configured to send the instruction information to the charger 20. The instruction information is used to instruct the charger 20 to adjust the output current. For example, the first preset threshold is 3 V. The detection circuit 110 detects the value of the voltage between the positive and negative electrodes of the battery 140, and the detected value of the voltage between the positive and negative electrodes is 2.5 V. The CPU 150 determines that the value of the voltage between the positive and negative electrodes is less than the first preset threshold, and instructs the charger 20 to perform charging in a slow charging manner. If the detected voltage value is 3.5 V, the CPU 150 determines that the value of the voltage between the positive and negative electrodes is greater than the first preset threshold, and instructs the charger 20 to perform charging in a fast charging manner. The slow charging manner has a corresponding output current (which may be a current value, or may be a value range). The fast charging manner also has a corresponding output current (which may be a current value, or may be a value range).

Further, it should be noted that, an electricity quantity of the battery 140 is continuously accumulated as time goes by, and then the detection circuit 110 detects a battery level of the battery 140, and determines whether the battery 140 is fully charged. Therefore, the CPU 150 is further configured to, when detecting that the voltage of the battery 140 reaches a second preset threshold, send a break connection notification to the receiver 170. The receiver 170 is configured to break an electrical connection to the charger 20 according to the break connection notification. Optionally, when detecting that the voltage of the battery 140 reaches the second preset threshold, the CPU 150 may further instruct the charger 20 to enter a sleep mode such that the charger 20 stops supplying power.

The detection circuit 110 may be further configured to detect a current of the battery 140 and a state of charge of the battery 140. When the current is excessively large or charges are consumed excessively quickly, the detection circuit 110 gives a notification on an interface of the terminal 10.

It should be noted that in this embodiment of the present application, the terminal 10 may further include a memory and a bus system (not shown). The CPU 150 and the memory are connected using the bus system. The memory is configured to store an instruction. The CPU 150 is configured to execute the instruction stored in the memory such that the terminal 10 performs the fast charging method. It should be understood that in this embodiment of the present application, the CPU 150 may be another general-purpose processor, a Digital Signal Processor (DSP), an Application Specific Integrated Circuit (ASIC), a Field-Programmable Gate Array (FPGA) or another programmable logic device, a discrete gate or a transistor logic device, a discrete hardware component, or the like. The general-purpose processor may be a microprocessor, or the CPU may be any conventional processor. The memory may include a read-only memory (ROM) and a random access memory (RAM), and provide an instruction and data for the CPU. A part of the memory may further include a nonvolatile RAM. For example, the memory may further store information about a device type. In addition to a data bus, the bus system may include a power bus, a control bus, a status signal bus, and the like.

As shown in FIG. 3A, the charger 20 in the FCS includes a receiver 210, a voltage adjustment circuit 220, and a current adjustment circuit 230.

The receiver 210 is configured to receive instruction information sent by the terminal 10, where the instruction information includes a value of a voltage between positive and negative electrodes of the battery in the terminal 10 and K times the value of the voltage between the positive and negative electrodes, and K is any real number greater than 1.

The voltage adjustment circuit 220 is configured to adjust a voltage value of an output voltage to K times the value of the voltage between the positive and negative electrodes of the battery 140.

The current adjustment circuit 230 is configured to determine a charging mode according to the value of the voltage between the positive and negative electrodes of the battery 140, obtain a current value corresponding to the charging mode, and adjust an output current according to the corresponding current value.

Optionally, the charger 20 is connected to a power supply. Therefore, the charger 20 includes an alternating current (AC)/DC conversion circuit in order to convert an AC provided by the power supply into a DC.

It may be understood that, in the present application, the terminal 10 uses a DC/DC conversion manner with a fixed conversion ratio, works with a fixed duty cycle, and continuously adjusts the output voltage and the output current of the charger based on a real-time voltage feedback of the battery. Conversion efficiency of the DC/DC conversion manner is higher such that a charging current output to the battery on a mobile phone side can be larger, and charging efficiency of the entire FCS is effectively improved, thereby effectively shortening a fast charging time.

For the FCS in FIG. 1, an embodiment of the present application further provides a charging method. The method includes a terminal side method and a charger side method.

Figure 6:
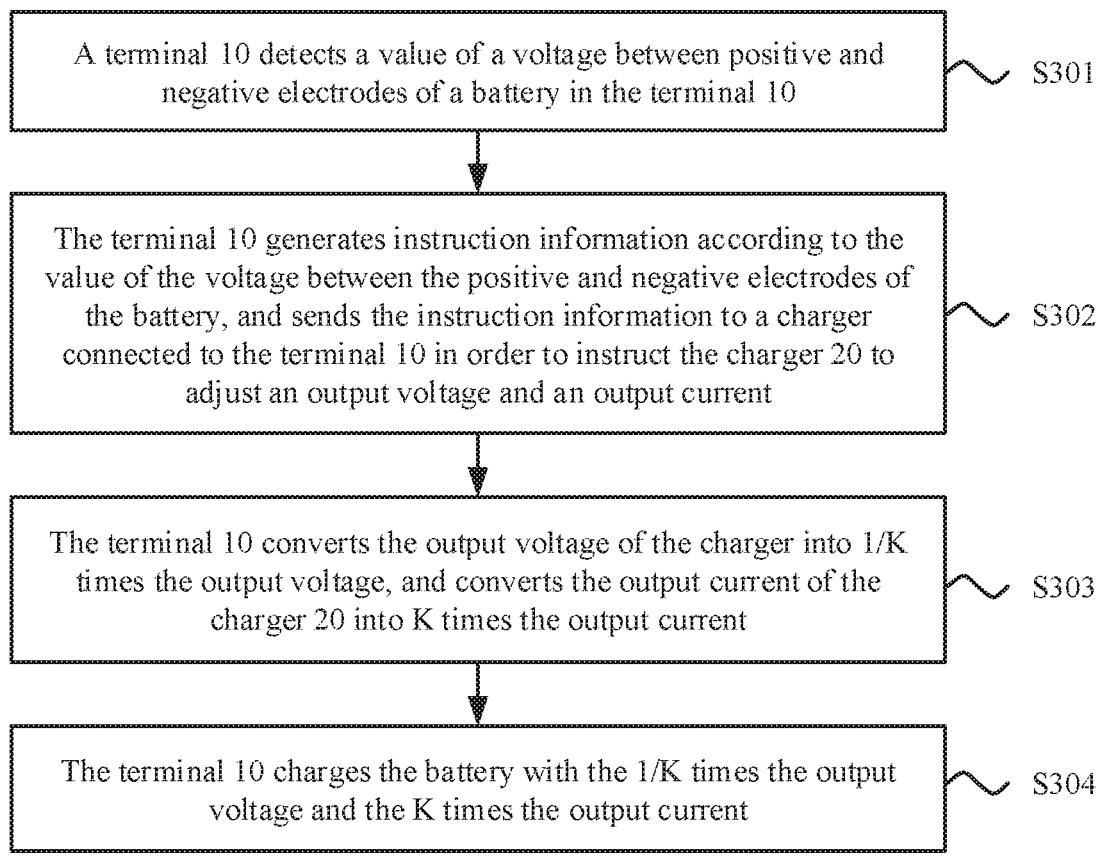
FIG. 6 is a flowchart of a fast charging method according to another embodiment of the present application.

As shown in FIG. 6, the fast charging method on a terminal side includes the following steps.

Step S301. A terminal 10 detects a value of a voltage between positive and negative electrodes of a battery in the terminal 10.

Step S302. The terminal 10 generates instruction information according to the value of the voltage between the positive and negative electrodes of the battery, and sends the instruction information to a charger connected to the terminal 10 in order to instruct the charger 20 to adjust an output voltage and an output current.

Step S303. The terminal 10 converts the output voltage of the charger into 1/K times the output voltage, and converts the output current of the charger 20 into K times the output current, where K is a conversion coefficient of a conversion circuit with a fixed conversion ratio in the terminal 10, K is a constant value, and K is any real number greater than 1.

Step S304. The terminal 10 charges the battery with the 1/K times the output voltage and the K times the output current.

It may be understood that in a fast charging process, the voltage between the positive and negative electrodes of the battery in the terminal 10 continuously changes, and the battery needs to be charged with different currents according to different voltage ranges of the battery.

Therefore, that the terminal 10 generates the instruction information according to the value of the voltage between the positive and negative electrodes of the battery includes the following.

The terminal 10 compares the value of the voltage between the positive and negative electrodes with a first preset threshold to obtain a comparison result, and generates the instruction information according to the comparison result. Further, it should be noted that the terminal 10 needs to continuously detect whether the battery is fully charged, and when the battery is fully charged, needs to instruct the charger 20 to stop charging or disconnect an electrical connection to the charger 20. Optionally, the terminal 10 may detect whether the voltage between the positive and negative electrodes of the battery reaches a second preset threshold, and when detecting that the voltage between the positive and negative electrodes of the battery reaches the second preset threshold, disconnects an electrical connection between the terminal 10 and the charger 20.

Figure 7:
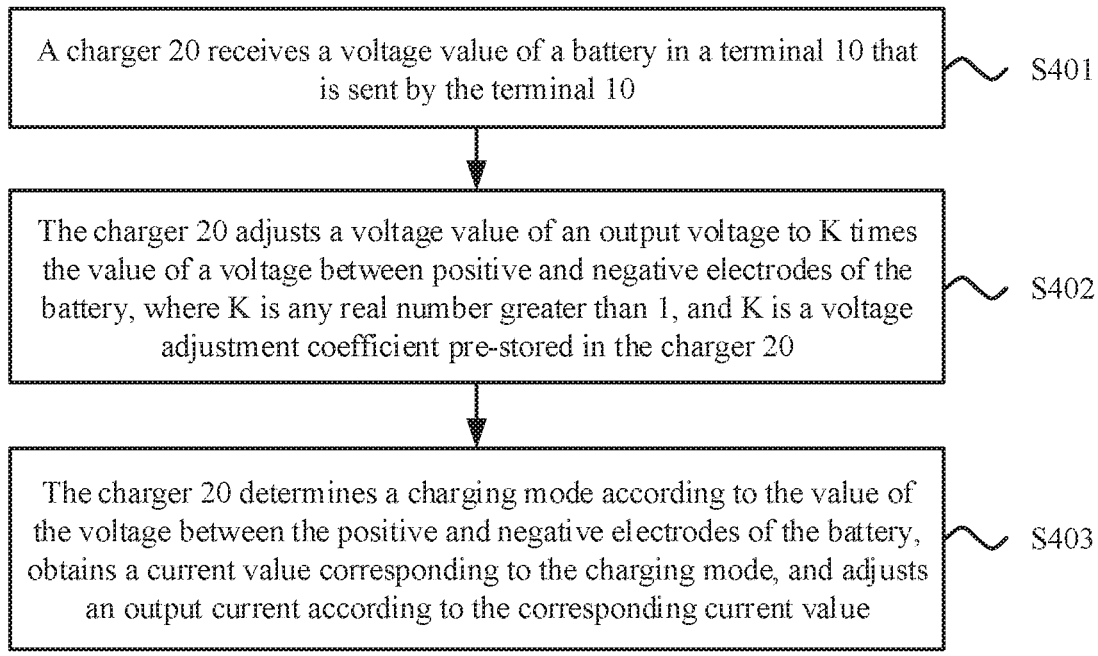
FIG. 7 is a flowchart of a fast charging method according to another embodiment of the present application.

As shown in FIG. 7, the fast charging method on a charger 20 side includes the following steps.

Step S401. A charger 20 receives instruction information sent by a terminal, where the instruction information includes a value of a voltage between positive and negative electrodes of a battery in the terminal 10.

Step S402. The charger 20 adjusts a voltage value of an output voltage to K times the value of the voltage between the positive and negative electrodes of the battery, where K is any real number greater than 1, and K is a voltage adjustment coefficient pre-stored in the charger 20.

Step S403. The charger 20 determines a charging mode according to the value of the voltage between the positive and negative electrodes of the battery, obtains a current value corresponding to the charging mode, and adjusts an output current according to the corresponding current value.

Figure 8:
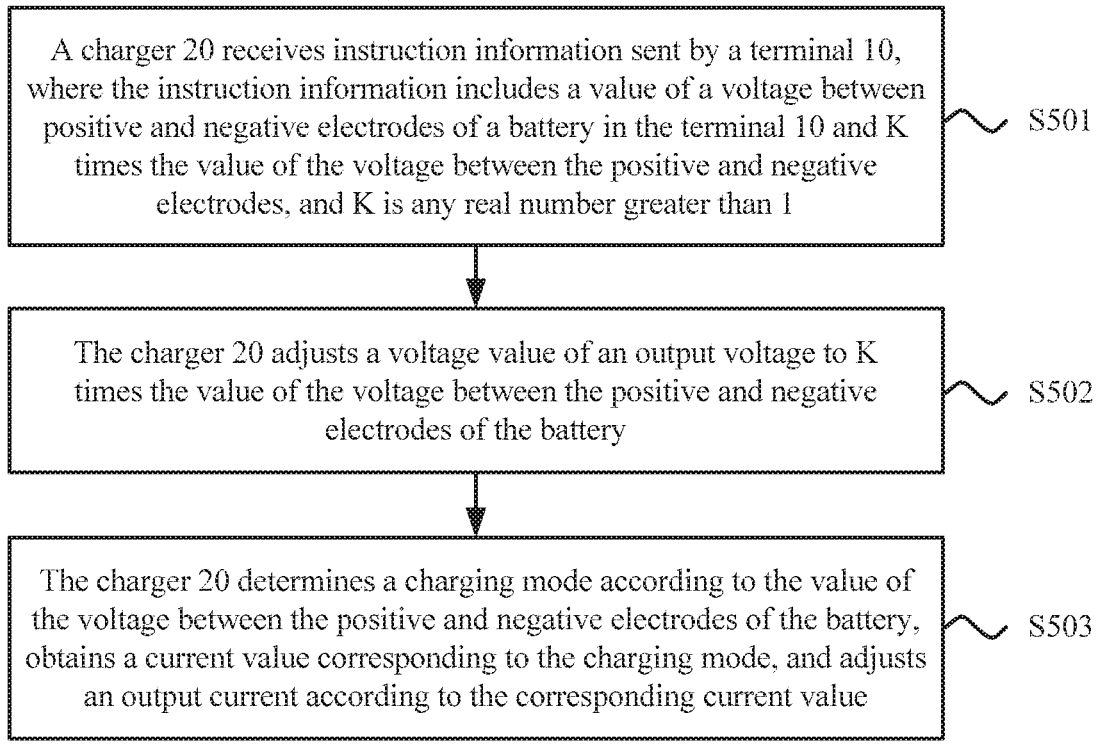
FIG. 8 is a flowchart of a fast charging method according to another embodiment of the present application.

As shown in FIG. 8, the fast charging method on a charger 20 side further includes the following steps.

Step S501. A charger 20 receives instruction information sent by a terminal 10, where the instruction information includes a value of a voltage between positive and negative electrodes of a battery in the terminal 10 and K times the value of the voltage between the positive and negative electrodes, and K is any real number greater than 1.

Step S502. The charger 20 adjusts a voltage value of an output voltage to K times the value of the voltage between the positive and negative electrodes of the battery.

Step S503. The charger 20 determines a charging mode according to the value of the voltage between the positive and negative electrodes of the battery, obtains a current value corresponding to the charging mode, and adjusts an output current according to the corresponding current value.

It may be understood that, in the present application, the terminal uses a DC/DC conversion manner with a fixed conversion ratio, works with a fixed duty cycle, and continuously adjusts the output voltage and the output current of the charger based on a real-time voltage feedback of the battery. Conversion efficiency of the DC/DC conversion manner is higher such that a charging current output to the battery on a mobile phone side can be larger, and charging efficiency of the entire FCS is effectively improved, thereby shortening a fast charging time.

In another fast charging embodiment provided in the present application, a charger and a mobile phone are used as an example for description.

(1) The charger is connected to the mobile phone.

(2) A voltage of a battery is detected in the mobile phone to obtain a voltage value V, and 2V is sent to the charger using a data cable, or may be sent to the charger using a wireless network (it is assumed that a conversion coefficient K of a conversion circuit with a fixed conversion ratio in the mobile phone is equal to 2).

(3) After receiving the voltage information, the charger first adjusts an output voltage to 2V or 2V×(1+x %) to prevent the battery from back feeding a current towards an input end. A value range of x is 1 to 10 (including 1 and 10).

(4) The charger instructs the mobile phone to enable charging.

(5) The charger determines whether fast charging can be performed. For example, when the voltage of the battery is only 2.7 V, the charger adjusts a current to a small current, to perform pre-charging with a small current until the voltage of the battery reaches 3 V. Then, the charger adjusts the current to 4 A, and the terminal is fast charged with 8 A according to the conversion coefficient.

(6) In a process of charging the mobile phone, the voltage of the battery is detected at an interval of a preset time, and it is determined, according to the voltage of the battery, whether to instruct the charger to adjust a value of a current. At the moment of detecting the voltage of the battery, charging may be stopped, or a charging current may be reduced.

For example, when the voltage of the battery is close to 4.2 V (for example, reaches 4.15 V), the mobile phone instructs the charger to enter a small current charging state or a constant voltage charging state. When the voltage reaches 4.2 V after charging, charging stops. In a fast charging process, the current may decrease as the voltage of the battery increases. The current may decrease in a stepped manner or a continuous manner. In the charging process, in addition to a consecutive direct current, an inconsecutive pulse current may be used for charging.

(7) After charging stops, one of the following states may be entered.

A. The charger no longer supplies a current to the mobile phone. A working current of the mobile phone is supplied by the battery. In this state, when the voltage of the battery reaches a value after discharging, for example, the voltage drops down to 4.1 V, charging is recovered.

B. The charger supplies a working current to the mobile phone, but a path used for charging the battery is cut off, and does not supply a charging current to the battery. In this case, the battery does not supply power to the mobile phone, and is always in a fully charged state until a connection between the charger and the mobile phone is broken.

Figure 9:
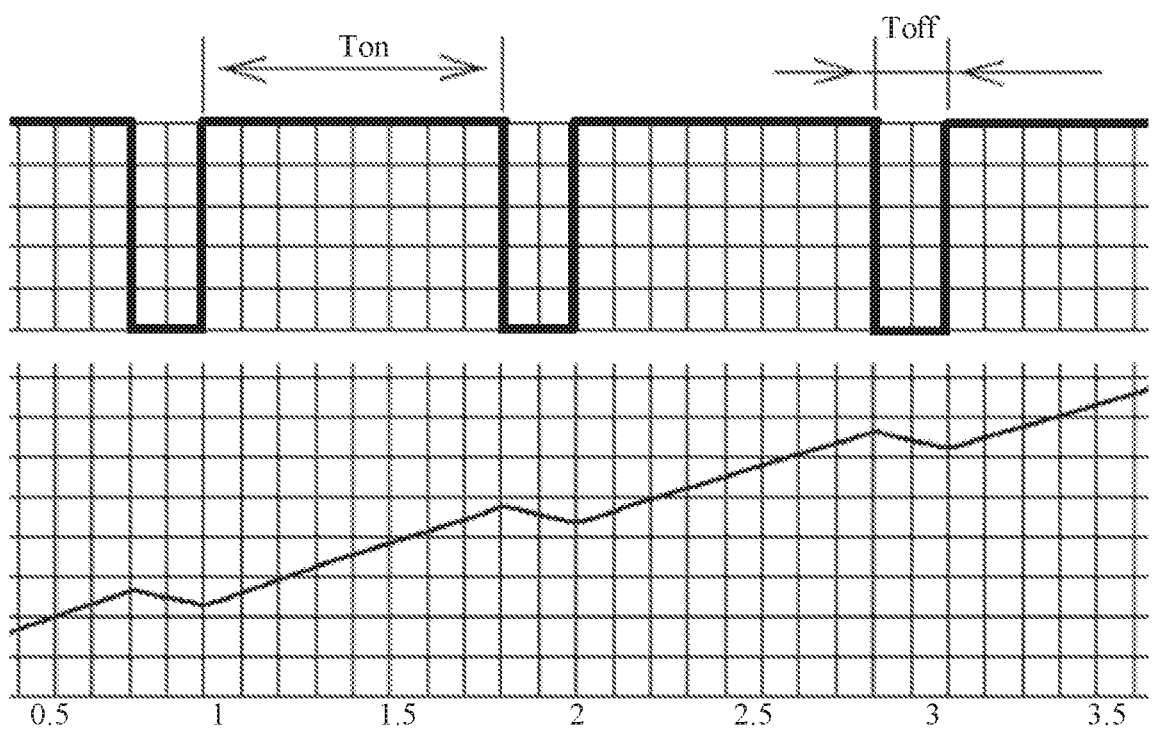
FIG. 9 is a schematic diagram of pulse current charging according to another embodiment of the present application.

In another fast charging embodiment of the present application, a specific pulse current charging implementation is provided. As shown in FIG. 9, an upper part of FIG. 9 is a pulse current waveform, and a lower part of FIG. 9 is a waveform when a voltage of a battery becomes higher after charging. A horizontal coordinate represents a time, and a vertical coordinate represents a charging current.

During a period of $T_{on}$, the charging current is a relatively large value, and the voltage of the battery rises.

During a period of $T_{off}$, the current is 0 or a relatively small value, and the voltage of the battery drops down. During the period of $T_{off}$, the voltage of the battery may be detected.

A current value during the period of $T_{on}$ may also vary according to the voltage of the battery. For example, at first, the voltage of the battery is 3 V, and a current during the period of $T_{on}$ is 8 A. When the voltage of the battery reaches 4.0 V, the current is adjusted to a small value of 6 A. When the voltage of the battery reaches 4.15 V, the current is adjusted to a small value of 3 A, until the battery is fully charged.

A value of the period of $T_{off}$ may change. For example, when the voltage of the battery reaches 4.2 V, the period of $T_{off}$ gets longer as a battery level gets closer to a full battery level. The process in which the period of $T_{off}$ gets longer may be implemented by detecting the voltage of the battery.

For example, after a charging pulse, the voltage of the battery necessarily slightly exceeds 4.2 V. Then, after the pulse ends, the voltage of the battery starts to drop down, and when the voltage drops down to 4.18 V, another pulse comes. A higher battery level necessarily leads to a longer time for the voltage to drop down to 4.18 V. When the time is long enough, it is considered that the battery is fully charged, and an electrical connection between the terminal and the charger can be broken.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present application.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, function units in the embodiments of the present application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present application essentially, or the part contributing to other approaches, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present application. The foregoing storage medium includes any medium that can store program code, such as a universal serial bus (USB) flash drive, a removable hard disk, a ROM, a RAM, a magnetic disk, or an optical disc.

The foregoing descriptions are merely specific implementations of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. A terminal, comprising:
a detection circuit configured to detect a value of a voltage between positive and negative electrodes of a battery;
a central processing unit (CPU) coupled to the detection circuit and the battery and configured to generate instruction information according to the value of the voltage between the positive and negative electrodes of the battery;
a transmitter coupled to the detection circuit, the battery, and the CPU and configured to send the instruction information to a charger coupled to the terminal instructing the charger to adjust an output voltage and an output current;
a receiver coupled to the detection circuit, the battery, the CPU, and the transmitter and configured to receive the output voltage and the output current transmitted from the charger, the receiver being electrically coupled to the charger;
a conversion circuit coupled to the detection circuit, the battery, the CPU, the transmitter, and the receiver and configured to:
convert the output voltage received by the receiver into 1/K times the output voltage, the K being a conversion coefficient; and
convert the output current received by the receiver into K times the output current, the conversion circuit comprising a fixed conversion ratio, the K being a constant value, and K being any real number greater than one; and
a charging circuit coupled to the detection circuit, the battery, the CPU, the transmitter, the receiver, and the conversion circuit and configured to charge the battery with the 1/K times the output voltage and the K times the output current.

2. The terminal of claim 1, wherein the CPU is further configured to:
compare the value of the voltage between the positive and negative electrodes with a first preset threshold to obtain a comparison result; and
generate the instruction information according to the comparison result.

3. The terminal of claim 1, wherein the CPU is further configured to send a break connection notification to the receiver when detecting that the value of the voltage between the positive and negative electrodes of the battery reaches a second preset threshold, and the receiver being further configured to break an electrical coupling to the charger according to the break connection notification.

4. A fast charging system, comprising:
a charger; and
a terminal coupled to the charger using a connection cable and configured to:
obtain a value of a voltage between positive and negative electrodes of a battery in the terminal;
generate instruction information according to the value of the voltage between the positive and negative electrodes of the battery; and
send the instruction information to the charger,
the charger being configured to:

adjust a voltage value of an output voltage to K times the value of the voltage between the positive and negative electrodes of the battery according to the instruction information, the K being any real number greater than one;

determine a charging mode according to the instruction information;

obtain a current value corresponding to the charging mode; and adjust an output current according to the corresponding current value, and the terminal being further configured to:

convert the output voltage of the charger into 1/K times the output voltage; and convert the output current of the charger into K times the output current to enable a charging circuit between two ends of the battery to charge the battery with the 1/K times the output voltage and the K times the output current, the K being a conversion coefficient of a conversion circuit with a fixed conversion ratio in the terminal, and the K being a constant value.

5. The system of claim 4, wherein in a manner of generating the instruction information, the terminal is further configured to:

compare the value of the voltage between the positive and negative electrodes with a first preset threshold to obtain a comparison result; and generate the instruction information according to the comparison result.

6. The system of claim 4, wherein the terminal is further configured to:

detect whether the voltage between the positive and negative electrodes of the battery reaches a second preset threshold; and break an electrical coupling between the terminal and the charger when the voltage between the positive and negative electrodes of the battery reaches the second preset threshold.

7. A fast charging method, comprising:

detecting, by a terminal, a value of a voltage between positive and negative electrodes of a battery in the terminal;

generating, by the terminal, instruction information according to the value of the voltage between the positive and negative electrodes of the battery;

sending, by the terminal, the instruction information to a charger coupled to the terminal instructing the charger to adjust an output voltage and an output current;

receiving, by the terminal, the output voltage and the output current transmitted from the charger;

converting, by the terminal, the output voltage of the charger into 1/K times the output voltage;

converting, by the terminal, the output current of the charger into K times the output current, the K being a conversion coefficient of a conversion circuit with a fixed conversion ratio in the terminal, the K being a constant value, and K being any real number greater than one; and charging, by the terminal, the battery with the 1/K times the output voltage and the K times the output current.

8. The method of claim 7, wherein generating the instruction information comprises:

comparing, by the terminal, the value of the voltage between the positive and negative electrodes with a first preset threshold to obtain a comparison result; and generating, by the terminal, the instruction information according to the comparison result.

9. The method of claim 8, further comprising:

detecting, by the terminal, whether the voltage between the positive and negative electrodes of the battery reaches a second preset threshold; and breaking, by the terminal, an electrical coupling between the terminal and the charger when the voltage between the positive and negative electrodes of the battery reaches the second preset threshold.

* * * * *